United States Patent
Lee et al.

(10) Patent No.: US 7,038,501 B2
(45) Date of Patent: May 2, 2006

(54) TRANSCONDUCTOR CIRCUIT FOR COMPENSATING THE DISTORTION OF OUTPUT CURRENT

(75) Inventors: Beaung Woo Lee, Daejeon (KR); Mun Yang Park, Daejeon (KR)

(73) Assignee: Electronics and Telecommunications Research Institute, (KR)

( * ) Notice: Subject to any disclaimer, the term of this patent is extended or adjusted under 35 U.S.C. 154(b) by 18 days.

(21) Appl. No.: 10/941,333

(22) Filed: Sep. 14, 2004

(65) Prior Publication Data

US 2005/0134329 A1    Jun. 23, 2005

(30) Foreign Application Priority Data

Dec. 23, 2003    (KR) .................. 10-2003-0095399

(51) Int. Cl.
 *H03K 3/00*    (2006.01)
(52) U.S. Cl. .................. 327/108; 327/563; 330/253
(58) Field of Classification Search ........ 327/108–112, 327/563; 330/252, 253
See application file for complete search history.

(56) References Cited

U.S. PATENT DOCUMENTS

| | | | |
|---|---|---|---|
| 4,720,685 A | 1/1988 | Garuts | |
| 5,598,117 A * | 1/1997 | Deguchi | 327/103 |
| 5,774,020 A | 6/1998 | Kimura | |
| 6,242,980 B1 | 6/2001 | Tsukagoshi et al. | |
| 6,577,170 B1 | 6/2003 | Prodanov | |

FOREIGN PATENT DOCUMENTS

JP    05-259761    10/1993
KR    1020020035324    5/2002

OTHER PUBLICATIONS

"A Linear Fully Balanced CMOS OTA for VHF Filtering Applications", IEEE Transactions on Circuits and Systems, vol. 44, No. 3, Mar. 1997, pp. 174-317.

* cited by examiner

*Primary Examiner*—Kenneth B. Wells
(74) *Attorney, Agent, or Firm*—Blakely Sokoloff Taylor & Zafman

(57) ABSTRACT

Provided is a transconductor circuit for compensating distortion of an output current without reducing the size of chips and operation speed characteristics. The transconductor circuit includes a main circuitry which is a differential pair with source degeneration and to which a predetermined input voltage is applied, an auxiliary circuitry which is connected to nodes of the main circuitry to compensate the distortion of the output current, a variable voltage supply which controls a depth or degree of a distortion compensation operation for the output current, and a current source which supplies the main circuitry with constant bias.

13 Claims, 6 Drawing Sheets

TRANSCONDUCTOR CIRCUIT FOR COMPENSATING THE DISTORTION OF OUTPUT CURRENT

BACKGROUND OF THE INVENTION

This application claims the priority of Korean Patent Application No. 2003-95399, filed on Dec. 23, 2003, in the Korean Intellectual Property Office, the disclosure of which is incorporated herein in its entirety by reference.

1. Field of the Invention

The present invention relates to a transconductor circuit, and more particularly, to a transconductor circuit including metal oxide semiconductor (MOS) transistors so as to prevent an output current from being distorted.

2. Description of the Related Art

In general, transconductors are circuits that convert a voltage into a current to process an electric signal. In other words, when a predetermined voltage is applied to the transconductors, the transconductors output a current value. Such a transconductor is generally used in an analog signal processor such as a filter, a gain variable amplifier, or the like.

The transconductor is processed by a highly integrated analog signal and includes MOS or complementary MOS (CMOS) transistors that are generally driven at a low voltage. The MOS transistors have merits in that an input gate current does not flow, power consumption is low, and integration is high.

FIG. 1 is a circuit diagram of a conventional transconductor circuit. Referring to FIG. 1, a transconductor circuit 10 includes an input unit 20, an output unit 30, and current sources 40.

The input unit 20 is a differential pair and includes first and second MOS transistors M1 and M2 and a resistor R1. First and second input voltages Vinn and Vinp are applied to gates of the first and second MOS transistors M1 and M2, respectively. A source of the first MOS transistor M1 is electrically connected to a source of the second MOS transistor M2 via the resistor R1. Here, the input unit 20 serves as a main circuitry of the transconductor circuit 10. Since the input unit 20 is the differential pair and includes a pair of the first and second MOS transistors M1 and M2 as above-mentioned, the input unit 20 is advantageous to operation speed characteristics. Here, an output current is less distorted when the resistor R1 exists than when the resistor R1 does not exist.

The output unit 30 is a cascode amplifier in which gates of third and fourth MOS transistors M3 and M4 are commonly connected. A source of the third MOS transistor M3 is connected to a drain of the first MOS transistor M1, and a source of the fourth MOS transistor M4 is connected to a drain of the second MOS transistor M2. Predetermined electric loads (not shown) are connected to drains of the third and fourth MOS transistors M3 and M4 so as to allow the output current to flow through the transconductor circuit 10. A power voltage Vdc is applied to gates of the third and fourth MOS transistors M3 and M4.

The current sources 40 are respectively connected between the first MOS transistor M1 and ground and between the second MOS transistor M2 and ground to supply the first and second MOS transistors M1 and M2 with constant bias.

It preferable that a gate-source voltage Vgs of the first and second MOS transistors M1 and M2 is low and transconductances gm of the first and second MOS transistors M1 and M2 are high in order to drive the transconductor circuit 10 at a low voltage. Also, it is preferable that gate-drain capacitances Cgd of the first and second MOS transistors M1 and M2 are low to improve fast operation characteristics. Moreover, the first and second MOS transistors M1 and M2 are preferably designed so that channel lengths are short and ratios of channel widths to channel lengths are great.

A transconductance Gm of the transconductor circuit 10 is a variation in the output current with respect to an input voltage and can be represented as in Equation:

$$Gm = \frac{d(Iout)}{d(Vin)} \quad (1)$$

wherein Iout denotes the output current that is a difference (Iop-Ion) between a second current Iop and a first current Ion, and Vin denotes the input voltage that is a difference (Vinp-Vinn) between the second input voltage Vinp and the first input voltage Vinn.

In the transconductor circuit 10, the first and second input voltages Vinn and Vinp applied to the first and second MOS transistors M1 and M2 of the input unit 20 vary the first and second currents Ion and Iop. Here, the output unit 30 is connected to an output node of the input unit 20 to increase entire output resistance in the transconductor circuit 10.

The transconductance Gm of the transconductor circuit 10 must be constant regardless of the intensity of the input voltage Vin. However, as shown in FIG. 2, the transconductance Gm of the transconductor circuit 10 gradually decreases when an absolute value of the input voltage Vin increases to a constant voltage or more. This means that the output current Iout of the transconductor circuit 10 is distorted.

The distortion of the output current Iout is generally caused by the nonlinear characteristics of the first and second MOS transistors M1 and M2 resulting from a power voltage and a bias current value generated from the power voltage. The distortion of the output current Iout may be considerably reduced by increasing the magnitude of the resistor R1 of the input unit 20.

However, the increase in the magnitude of the resistor R1 results in increasing the size of semiconductor chips and parasitic capacitance, which deteriorates integration density and operation speed.

Although the magnitude of the resistor R1 increases, the nonlinear characteristics of the first and second MOS transistors M1 and M2 and the current sources 40 do not vary. Also, as shown in FIG. 2, as the input voltage Vin of the transconductor circuit 10 gets close to a maximum input voltage Vmax, the distortion of the output current Iout becomes more serious. Furthermore, when the output current Iout is distorted, a region in which the output current Iout linearly increases is reduced.

SUMMARY OF THE INVENTION

According to an aspect of the present invention, there is provided a transconductor circuit for compensating distortion of an output current.

The transconductor circuit includes a main circuitry which is a differential pair with source generation and to which a predetermined input voltage is applied, an auxiliary circuitry which is connected to nodes of the main circuitry to compensate the distortion of the output current, a variable voltage supply which controls a depth or degree of a distortion compensation operation for the output current, and a current source which supplies the main circuitry with constant bias. When an absolute value of a total input voltage of the transconductor circuit is less than a constant voltage, the auxiliary circuitry includes MOS transistors that operate in sub-threshold regions. When the absolute value of the total input voltage is more than the constant voltage, the auxiliary circuitry includes MOS transistors that operate in saturation regions. The auxiliary circuitry contributes to compensating distortion of a total output current of the transconductor circuit.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
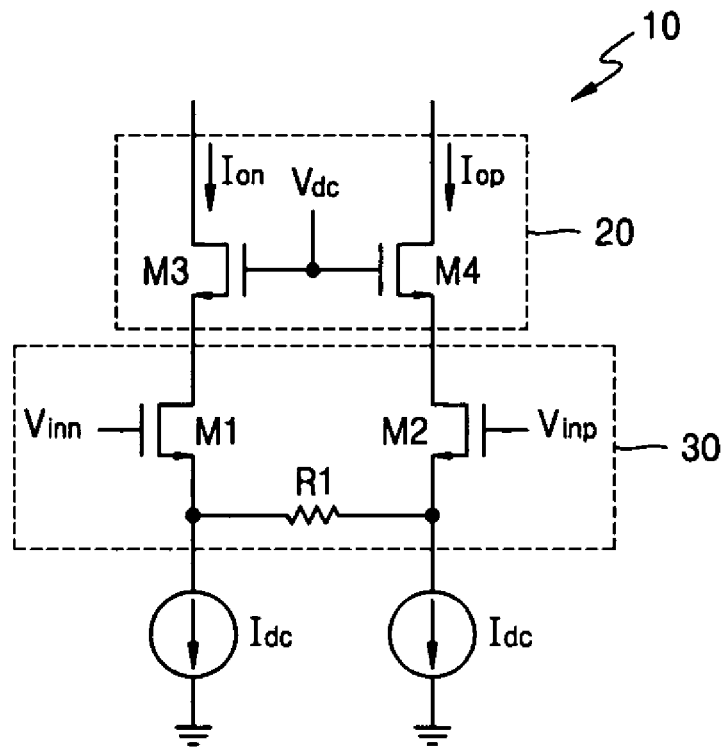
FIG. 1 is a circuit diagram of a conventional transconductor circuit.
Figure 2:
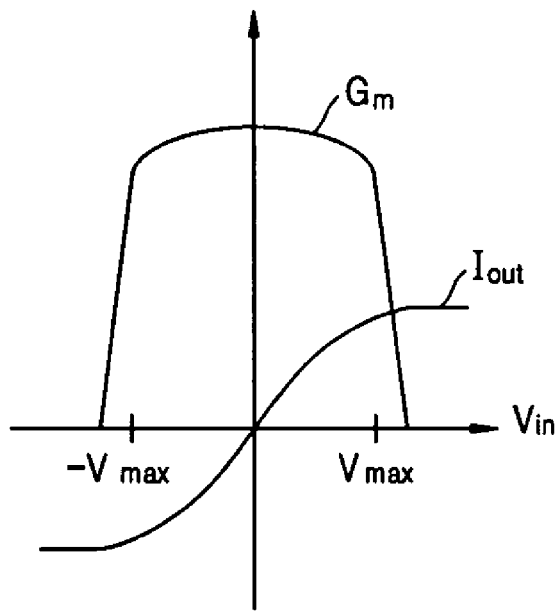
FIG. 2 is a graph for showing transconductance of the transconductor circuit of FIG. 1.

The present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art. In the drawings, the thicknesses of layers and regions are exaggerated for clarity. Like reference numerals in the drawings denote like elements, and thus their description will be omitted.

Figure 3:
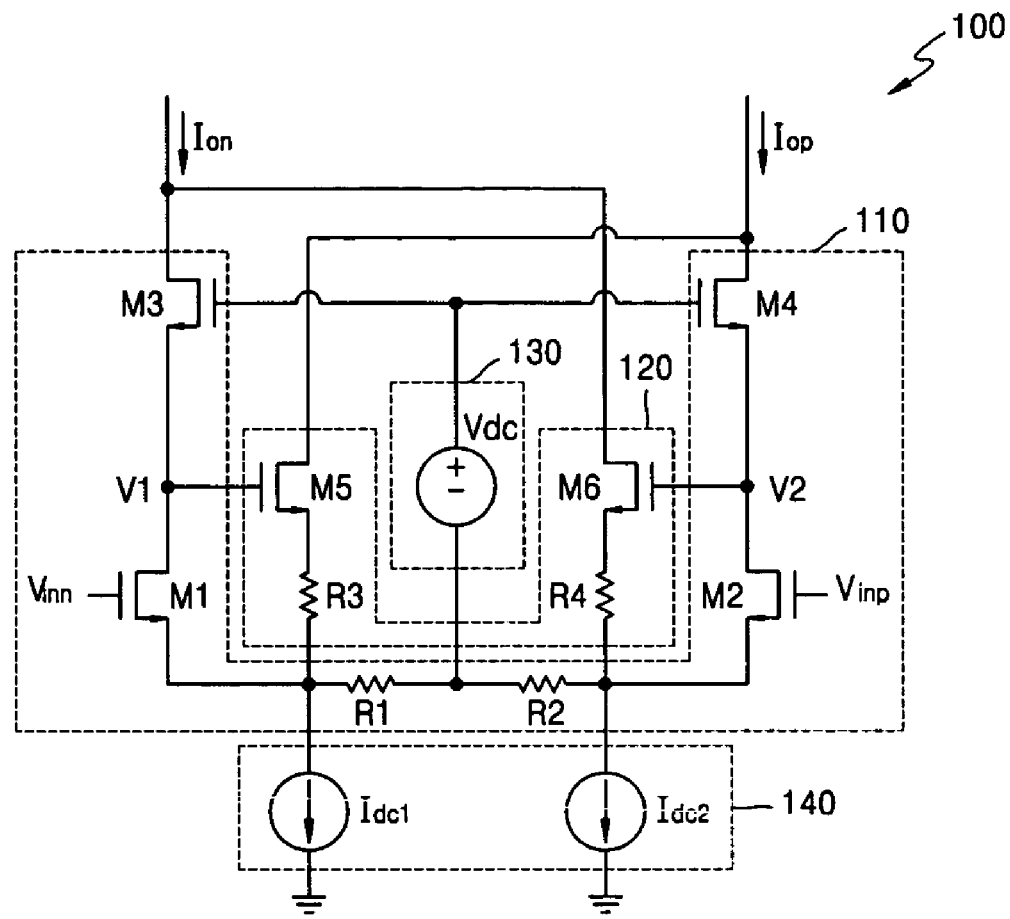
FIG. 3 is a circuit diagram of a transconductor circuit, according to an embodiment of the present invention.

FIG. 3 is a circuit diagram of a transconductor circuit, according to an embodiment of the present invention. Referring to FIG. 3, a transconductor circuit 100 includes a main circuitry 110, an auxiliary circuitry 120, a variable voltage supply 130, and a current source 140.

The main circuitry 110 is a differential pair with source degeneration and includes first through fourth MOS transistors M1 through M4 and first and second resistors R1 and R2.

First and second input voltages Vinn and Vinp are applied to gates of the first and second MOS transistors M1 and M2, respectively. Sources of the first and second MOS transistors M1 and M2 are electrically interconnected via the first and second resistors R1 and R2.

Gates of the third and fourth MOS transistor M3 and M4 are interconnected. A source of the third MOS transistor M3 is connected to a drain of the first MOS transistor M1, and a source of the fourth MOS transistor M4 is connected to a drain of the second MOS transistor M2. Predetermined electric loads (not shown) are connected to drains of the third and fourth MOS transistors M3 and M4 to allow an output current to flow through the transconductor circuit 100. The magnitude of the first and second resistors R1 and R2 may be arbitrarily controlled by a designer, for example, may be about several $\Omega$ to millions $\Omega$. An input voltage Vin of the transconductor circuit 100 is a difference between the second input voltage Vinp and the first input voltage Vinn, and an output current Iout of the transconductor circuit 100 is a difference between a second output current Iop and a first output current Ion.

The auxiliary circuitry 120 includes fifth and sixth MOS transistors M5 and M6 and third and fourth resistors R3 and R4. In more detail, a gate of the fifth MOS transistor M5 is connected to the drain of the first MOS transistor M1, a source of the fifth MOS transistor M5 is connected to an end of the third resistor R3, and a drain of the fifth MOS transistor M5 is connected to the drain of the fourth MOS transistor M4. The other end of the third resistor R3 is connected to the source of the first MOS transistor M1 of the main circuitry 110. A gate of the sixth MOS transistor M6 is connected to the drain of the second MOS transistor M2, a source of the sixth MOS transistor M6 is connected to an end of the fourth resistor R4, and a drain of the sixth MOS transistor M6 is connected to a drain of the third MOS transistor M3. The other end of the fourth resistor R4 is connected to the source of the second MOS transistor M2 of the main circuitry 110.

As another aspect, in the circuit diagram of FIG. 3, the drain of the fifth MOS transistor M5 may be connected to the source of the fourth MOS transistor M4, and the drain of the sixth MOS transistor M6 may be connected to the source of the third MOS transistor M3.

The magnitude of the third and fourth resistors R3 and R4 may be arbitrarily controlled by a designer, for example, may be several $\Omega$ to millions $\Omega$. Here, V1 denotes a gate voltage of the fifth MOS transistor M5, and V2 denotes a gate voltage of the sixth MOS transistor M6. The auxiliary circuitry 120, particularly the fifth and sixth MOS transistors M5 and M6, substantially serve to prevent an output current of the main circuitry 110 from being distorted.

The variable voltage supply 130 is a voltage source for supplying a direct current (DC) voltage Vdc and is connected between a node to which gates of the third and fourth MOS transistors M3 and M4 are commonly connected and a node to which the first and second resistors R1 and R2 are commonly connected.

The current source 140 includes first and second constant current sources Idc1 and Idc2. The first constant source Idc1 is connected between the source of the first MOS transistor M1 and a ground node to supply the first MOS transistor M1 with predetermined bias. The second constant current source Idc2 is connected between the source of the second MOS transistor M2 and a ground node to supply the second MOS transistor with predetermined bias.

There will now be explained the bias status of the entire transconductor circuit 100 when the input voltage Vin is "0". The first and second constant current sources Idc1 and Idc2 supply the first through fourth MOS transistors M1 through M4 with constant bias so that the first through fourth MOS transistors M1 through M4 operate in saturation regions. The variable voltage supply 130 sets the DC voltage Vdc so that all of the first through fourth MOS transistors M1 through M4 operate in the saturation regions and simultaneously the fifth and sixth MOS transistors M5 and M6 operate in sub-threshold regions. In other words, gate-source voltages Vgs of the fifth and sixth MOS transistors M5 and M6 are slightly lower than a threshold voltage Vth.

The operation of the transconductor circuit 100 will now be explained.

Figure 4:
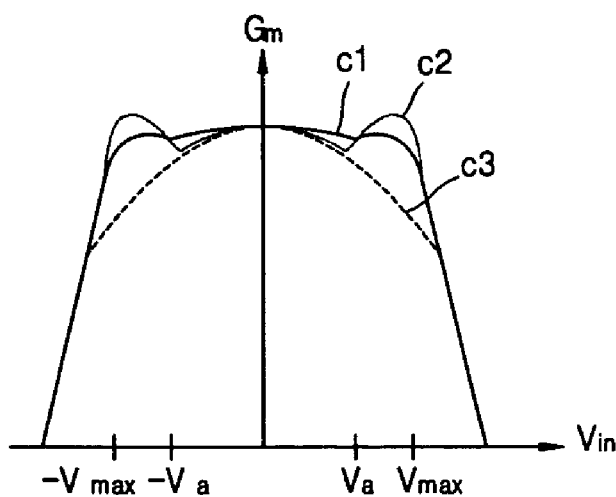
FIG. 4 is a graph for showing transconductance of the transconductor circuit of FIG. 3.

As shown in FIGS. 3 and 4, when an absolute value of the input voltage Vin of the transconductor circuit 100 is smaller than a constant voltage Va, the first through fourth MOS transistors M1 through M4 of the main circuitry 110 operate in their saturation regions, and the fifth and sixth MOS transistors M5 and M6 of the auxiliary circuitry 120 operate in the sub-threshold regions. A current of fine intensity then flows through the third and fourth resistors R3 and R4. As a result, a current flowing through the fifth and sixth MOS transistors M5 and M6 hardly affects an entire output current of the transconductor circuit 100.

When the input voltage Vin is greater than the constant voltage Va, the second input voltage Vinp increases more than the first input voltage Vinn. Thus, a current flowing through the first MOS transistor M1 is reduced, which boosts a drain voltage of the first MOS transistor M1. As a result, the gate-source voltage Vgs of the fifth MOS transistor M5 increases, and thus the fifth MOS transistor M5 enters the saturation region. A drain current of the fifth MOS transistor M5 in the saturation region increases more than when the input voltage Vin is "0". Thus, the output current Iout of the transconductor circuit 100 increases more than when the auxiliary circuitry 120 does not exist. As a result, transconductance Gm of the transconductor circuit 100 remains constant, and thus the distortion of the output current Iout is compensated. Here, the sixth MOS transistor M6 operates in the stronger sub-threshold region and a current flowing through the sixth MOS transistor M6 is very fine, which hardly affects the entire output current.

In other words, as marked with "C3" of FIG. 4, the transconductance Gm of the conventional transconductor circuit 10 is considerably reduced when the input voltage Vin is greater than the constant voltage Va. However, in the present invention, when the auxiliary circuitry 120 is connected to the main circuitry 110 and the input voltage Vin of the transconductor circuit 100 is greater than the constant voltage Va, the transconductance Gm of the transconductor circuit 100 remains almost constant as marked with "C1" of FIG. 4. As a result, the distortion of the output current is compensated.

When the magnitude of the third and fourth resistors R3 and R4 is relatively low, i.e., several Ω, channel lengths of the fifth and sixth MOS transistors M5 and M6 are too short, and the absolute value of the input voltage Vin is greater than the constant voltage Va, drain currents of the fifth and sixth MOS transistors M5 and M6 vary sharply. This may cause the output current to be distorted as marked with "C2" of FIG. 4. Therefore, the channel lengths and channel widths of the fifth and sixth MOS transistors M5 and M6 and the magnitude of the third and fourth resistors R3 and R4 must be determined in consideration of the magnitude of the transconductance Gm.

When the input voltage Vin increases in a positive direction to be greater than a maximum input voltage Vmax, all bias currents supplied by the current source 140 flow through the second and fifth MOS transistors M2 and M5, and currents do not flow through the first and sixth MOS transistors M1 and M6 any longer. Thus, the transconductance Gm, which is a variation in the output current, approaches "0". When the input voltage Vin increases in a negative direction, the similar results may be obtained.

Here, the voltage supplied by the variable voltage supply 130 satisfies both the following two cases. When the absolute value of the input voltage Vin is smaller than the constant voltage Va, the voltage supplied by the variable voltage supply 130 is set so that the fifth and sixth MOS transistors M5 and M6 operate in the sub-threshold regions. When the absolute value of the input voltage Vin is greater than the constant voltage Va, the voltage supplied by the variable voltage supply 130 is set so that at least one of the fifth and sixth MOS transistors M5 and M6 necessarily operates in the saturation region.

Here, the constant voltage Va can be represented relative to the variable voltage supply 130 as in Equation 2:

$$Vdc+Gm \cdot Va \cdot R1=Vgs3+Vth5 \qquad (2)$$

wherein Vgs3 denotes a gate-source voltage of the third MOS transistor M3 when the input voltage Vin of the transconductor circuit 100 is equal to the constant voltage Va and Vth5 denotes a threshold voltage of the fifth MOS transistor M5. Here, since each of the main and auxiliary circuitries 110 and 120 is composed of a differential amplifier type, the first resistor R1 has the same magnitude as the second resistor R2, and the third resistor R3 has the same magnitude as the fourth resistor R4. In a simulation according to an aspect of the present invention, the constant voltage Va is about ⅔ of the maximum input voltage Vmax when the distortion of the entire output current is minimum.

Figure 5:
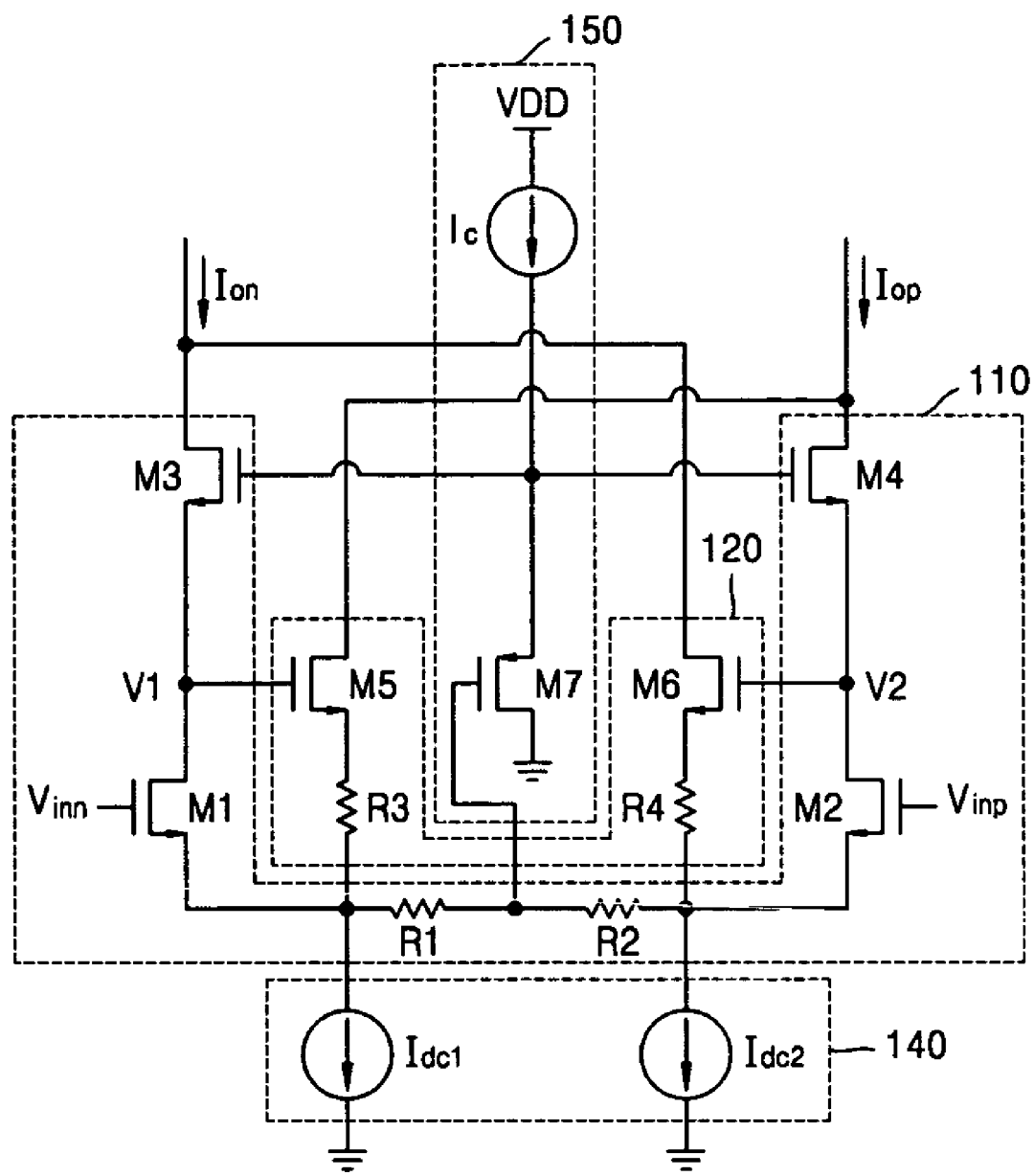
FIG. 5 is a circuit diagram of a transconductor circuit, according to another embodiment of the present invention.

FIG. 5 is a circuit diagram of a transconductor circuit, according to another embodiment of the present invention. Referring to FIG. 5, a voltage controller 150 includes a seventh MOS transistor M7 and a current source Ic. The seventh MOS transistor M7 is a p-channel MOS (PMOS) transistor, a gate of which is connected to a node to which the third and fourth resistors R3 and R4 are commonly connected and a drain of which is grounded. The current source Ic is connected between a source of the seventh MOS transistor M7 and a power voltage VDD. The current source Ic supplies the seventh MOS transistor M7 with bias and the fifth and sixth MOS transistors M5 and M6 with the gate-source voltages Vgs.

In other words, when the input voltage Vin is greater than a negative constant voltage −Va and smaller than the positive constant voltage Va, the current source Ic supplies the fifth and sixth MOS transistors M5 and M6 of the auxiliary circuitry 120 with bias so that the fifth and sixth MOS transistors M5 and M6 operate in the sub-threshold regions.

Even when the variable voltage supply 130 of FIG. 3 is constituted as the voltage controller 150 including the current source Ic and the PMOS transistor, the same effect can be achieved.

Figure 8:
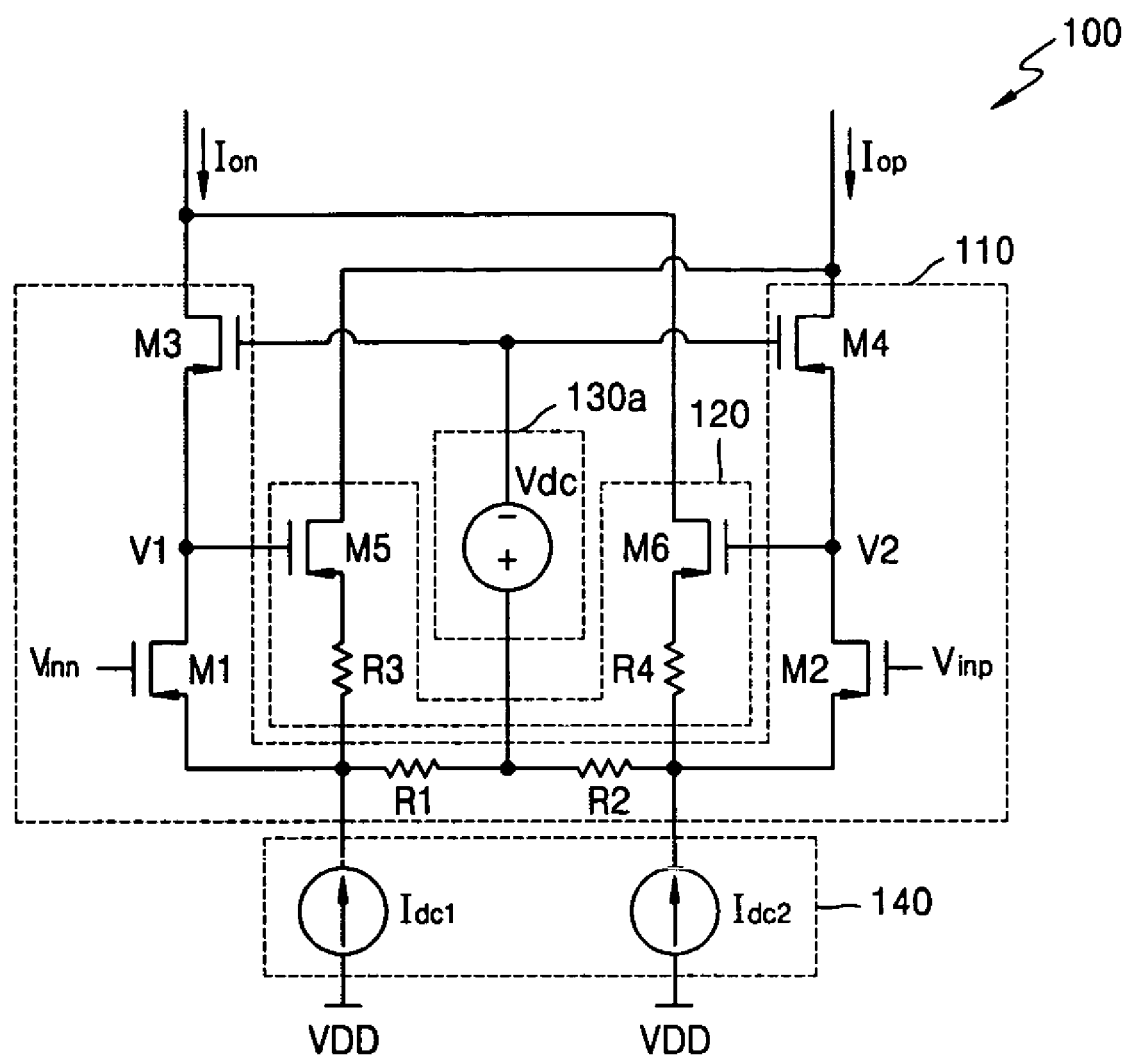
FIG. 8 is a circuit diagram of a transconductor circuit, according to still another embodiment of the present invention.

As an aspect of the present invention, the first through sixth MOS transistors M1 through M6 of the transconductor circuit 100 of FIG. 3 are n-channel MOS (NMOS) transistors. However, as another aspect, the first through sixth MOS transistors M1 through M6 may be PMOS transistors as shown in FIG. 8. In this case, polarities of the first and second constant current sources Idc1 and Idc2, the voltage Vdc of the variable voltage supply 130, and voltage supply sources (the power voltage VDD and ground) must be changed into opposite polarities.

Figure 9:
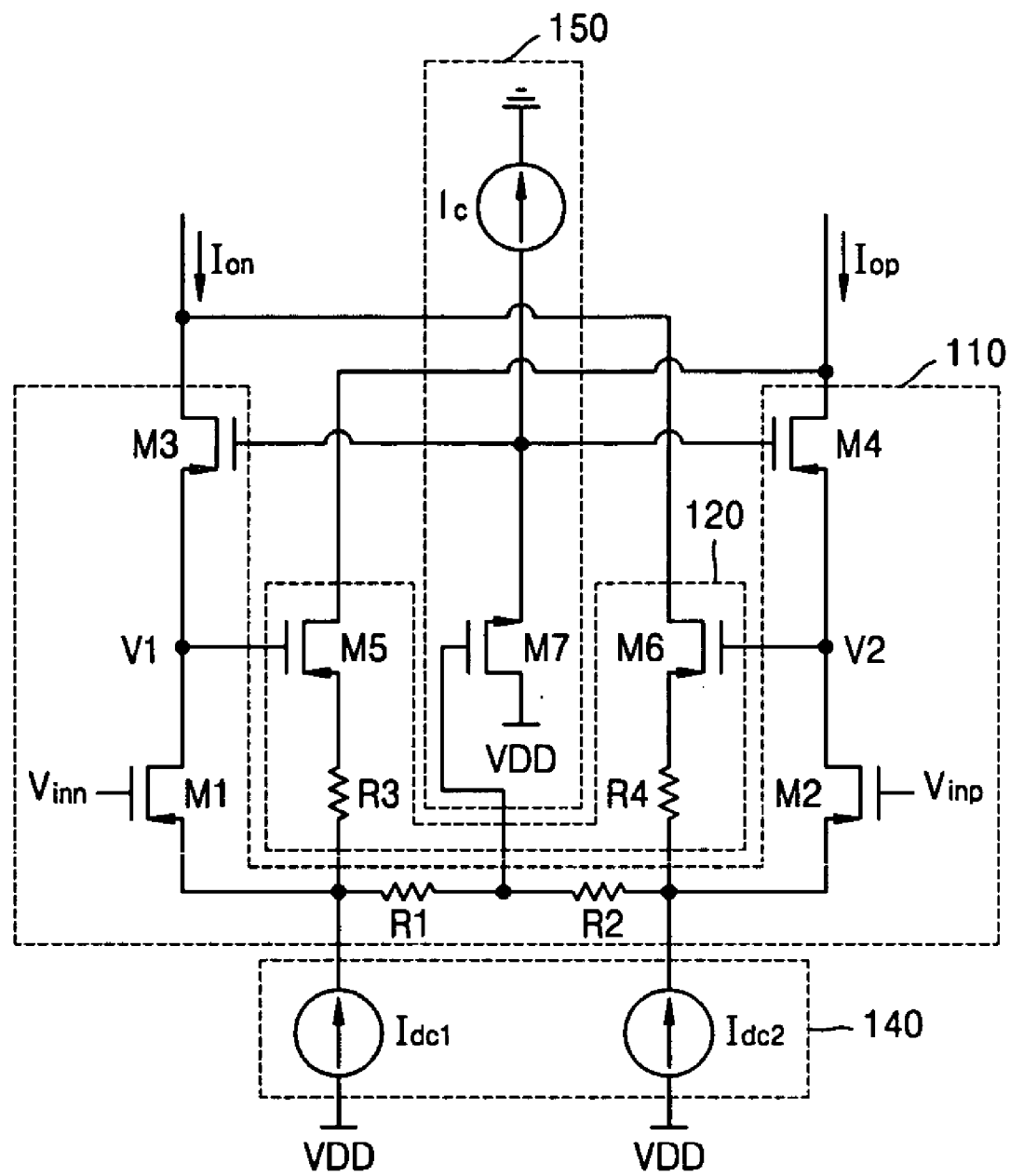
FIG. 9 is a circuit diagram of a transconductor circuit, according to yet another embodiment of the present invention.

As an aspect of the present invention, the first through sixth MOS transistors M1 through M6 of the transconductor circuit 100 of FIG. 5 are NMOS transistors, and the seventh MOS transistor M7 is the PMOS transistor. However, as another aspect, the first through sixth MOS transistors M1 through M6 may be PMOS transistors, and the seventh MOS transistor M7 may be an NMOS transistor as shown in FIG. 9. In this case, the polarities of the first and second constant current sources Idc1 and Idc2, the current source Ic of the voltage controller 150, and the voltage supply sources (the power voltage VDD arid ground) must be changed into opposite polarities.

As another aspect, all of current sources of FIGS. 3 and 5 may be simple MOS transistors.

Figure 6:
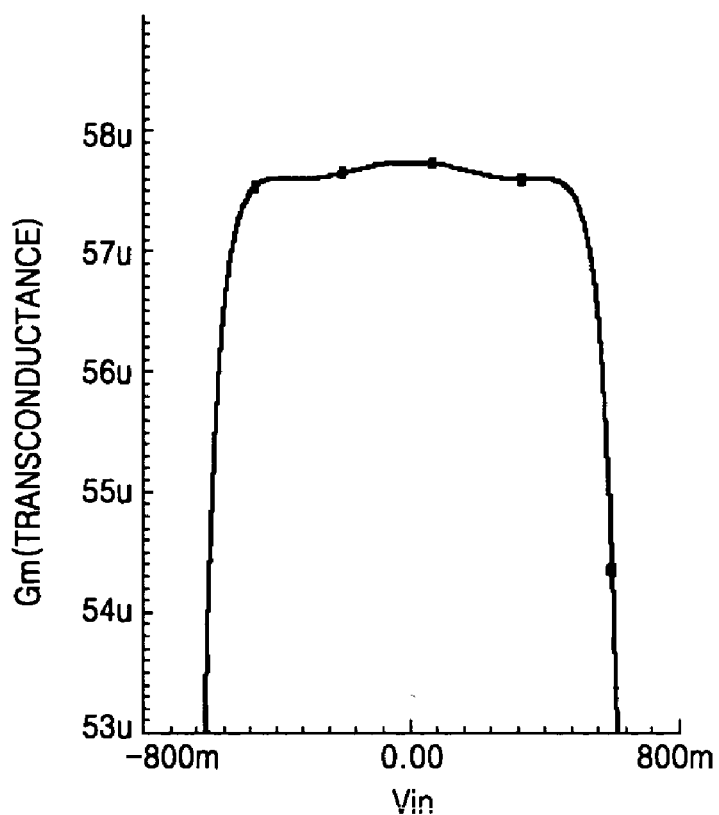
FIG. 6 is a graph for showing the results of a simulation for transconductance of the transconductor circuit of FIG. 5.

FIG. 6 is a graph for showing the results of a simulation for transconductance of the transconductor circuit 100. The simulation was carried out in conditions that a power voltage of 1.8V was applied and an input voltage of the transconductor circuit 100 was biased by about 0.9V. A curve of the transconductance Gm of FIG. 6 has the almost same shape as a curve of the transconductance Gm of FIG. 4. This indicates that the auxiliary circuitry 120 prevents the output current Iout from being distorted.

Figure 7:
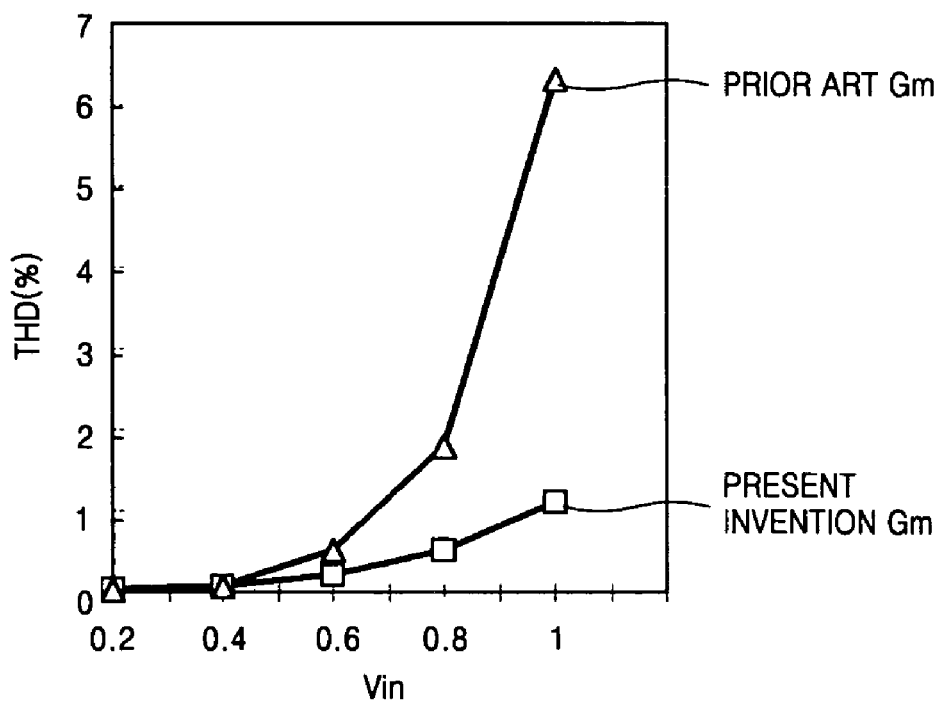
FIG. 7 is a graph for showing the results of a simulation for the distortion characteristics of an output current of a transconductor circuit according to the present invention.

FIG. 7 is a graph for showing the results of a simulation for the distortion characteristics of the transconductor circuit 100. In the simulation, an input frequency was set to 5 MHz, and a differential sine wave was input between the first and second input voltages Vinn and Vinp. The distortion characteristics will be described with total harmonic distortion (THD) of an output current that was analyzed in a frequency domain under the above conditions. As can be seen in FIG. 7, as the input voltage Vin increases, the transconductance Gm of the transconductor circuit 100 according to the present invention has a smaller THD value than the transconductance Gm of the conventional transconductor circuit 10. This indicates that the distortion of the output current of the transconductor circuit 100 is reduced.

As described above, in a transconductor circuit according to the present invention, an auxiliary circuitry is connected to an output node of a main circuitry that is a differential pair with source degeneration.

The auxiliary circuitry includes a pair of MOS transistors and a pair of resistors and is designed so as to operate in a sub-threshold region at less than a constant input voltage and in a saturation region at more than the constant input voltage. Thus, a reduction in the linearity of an output current of the main circuitry can be compensated at more than the constant input voltage. As a result, the distortion of an output current of the transconductor circuit be prevented and a section in which the output current linearly increases can increase. Moreover, since the auxiliary circuitry includes the pair of MOS transistors and/or the pair of resistors, the auxiliary circuitry can have a quite simple structure. Thus, chips cannot occupy the large area and an operation speed cannot be lowered.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A transconductor circuit comprising:
    a main circuitry comprising a first MOS transistor, a second MOS transistor connected to the first MOS transistor to be a differential pair, a third MOS transistor connected to a drain of the first MOS transistor, a fourth MOS transistor connected to a drain of the second MOS transistor, and first and second resistors serially connected between sources of the first and second MOS transistors;
    an auxiliary circuitry comprising a fifth MOS transistor and a third resistor that are connected between the first MOS transistor and the first resistor and a sixth MOS transistor and a fourth resistor that are connected between the second MOS transistor and the second resistor;
    a variable voltage supply which controls an operation of the auxiliary circuitry; and
    a current source which supplies the main circuitry with a bias current.

2. The transconductor circuit of claim 1, wherein:
    a first input voltage is applied to a gate of the first MOS transistor of the main circuitry;
    a second input voltage is applied to a gate of the second MOS transistor; and
    an input voltage is a difference between the first and second input voltages.

3. The transconductor circuit of claim 1, wherein gates of the third and fourth MOS transistors are connected to each other, and sources of the third and fourth MOS transistors are connected to drains of the first and second MOS transistors, respectively.

4. The transconductor circuit of claim 1, wherein:
    a gate of the fifth MOS transistor is connected to the drain of the first MOS transistor and a drain of the fifth MOS transistor is connected to a drain of the fourth MOS transistor;
    a gate of the sixth MOS transistor is connected to the drain of the second MOS transistor and a drain of the sixth MOS transistor is connected to a drain of the third MOS transistor; and
    the third, first, second, and fourth resistors are sequentially connected between sources of the fifth and sixth MOS transistors.

5. The transconductor circuit of claim 1, wherein the auxiliary circuitry is designed so that the fifth and sixth MOS transistors operate in sub-threshold regions when the input voltage is within a first range between a negative constant voltage −Va and a positive constant voltage Va, or so that one of the fifth and sixth MOS transistors necessarily operates in a saturation region when the input voltage is within a second range between less than the negative constant voltage −Va and more than the positive constant voltage Va.

6. The transconductor circuit of claim 1, wherein the variable voltage supply is a voltage source that is connected between a node to which the gates of the third and fourth MOS transistors are commonly connected and a node to which the first and second resistors are commonly connected.

7. The transconductor circuit of claim 1, wherein a voltage controller comprises:
    a seventh MOS transistor, a gate of which is connected to the node to which the first and second resistors are commonly connected and a source of which is connected to a current source; and
    the current source connected to the seventh MOS transistor.

8. The transconductor circuit of claim 7, wherein the seventh MOS transistor is a PMOS transistor.

9. The transconductor circuit of claim 7, wherein the seventh MOS transistor is an NMOS transistor.

10. The transconductor circuit of claim 1, wherein at least one of the first through sixth MOS transistors is one of an NMOS transistor and a PMOS transistor.

11. The transconductor circuit of claim 1, wherein the current source comprises:
   a first constant current source connected to the source of the first MOS transistor and the first resistor; and
   a second constant current source connected to the source of the second MOS transistor and the second resistor.

12. The transconductor circuit of claim 1, wherein the variable voltage supply controls an extent of distortion of an output current of the transconductor circuit.

13. The transconductor circuit of claim 1, wherein:
   a gate of the fifth MOS transistor is connected to the drain of the first MOS transistor and a drain of the fifth MOS transistor is connected to a drain of the fourth MOS transistor;
   a gate of the sixth MOS transistor is connected to the drain of the second MOS transistor and a drain of the sixth MOS transistor is connected to the source of the third MOS transistor; and
   the third, first, second, and fourth resistors are sequentially connected between sources of the fifth and sixth MOS transistors.

* * * * *